United States Patent [19]
Goodman et al.

[11] Patent Number: 5,959,606
[45] Date of Patent: *Sep. 28, 1999

[54] RASTERIZER FOR PATTERN GENERATOR

[75] Inventors: Allan L. Goodman, Hillsboro; Morris H. Green, Milwauki; Matthew J. Jolley, Hillsboro; Robin L. Teitzel, Portland; John L. Wipfli, Hillsboro, all of Oreg.

[73] Assignee: Etec Systems, Inc., Hayward, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/327,581

[22] Filed: Oct. 24, 1994

Related U.S. Application Data

[63] Continuation of application No. 07/689,083, Apr. 19, 1991, abandoned, which is a continuation of application No. 07/268,838, Nov. 8, 1988, abandoned, which is a continuation of application No. 06/784,856, Oct. 4, 1985, Pat. No. 4,806,921.

[51] Int. Cl.[6] .................................................. G09G 5/36
[52] U.S. Cl. ............................................ 345/133; 345/441
[58] Field of Search ................................... 345/112, 133, 345/134, 135, 136, 118, 127, 131, 147, 149, 150, 151, 152, 440, 441, 442, 443

[56] References Cited

U.S. PATENT DOCUMENTS

| 3,870,922 | 3/1975 | Shutoh | 340/747 |
|---|---|---|---|
| 4,280,186 | 7/1981 | Hidai et al. | 340/747 |
| 4,530,064 | 7/1985 | Takigawa et al. | 364/518 |

Primary Examiner—Xiao Wu
Attorney, Agent, or Firm—Skjerven, Morrill, MacPherson, Franklin & Friel LLP; Norman R. Klivans

[57] ABSTRACT

A rasterizer, particularly suited for generating patterns for semiconductor masks and the like is described. An 8×8 array uses RAS, CAS and WE signals in addition to the memory address for accessing the array. A state machine is used to convert the pattern data (e.g., type of object orientation, etc.) into accessing data with the WE generator being driven through a ROM.

14 Claims, 9 Drawing Sheets

VIDEO GENERATOR

RASTERIZER FOR PATTERN GENERATOR

This is a continuation of application Ser. No. 07/689,083 filed Apr. 19, 1991, now abandoned, which is a continuation of application Ser. No. 07/268,838, filed Nov. 8, 1988, now abandoned, which is a continuation of application Ser. No. 06/784,856, filed Oct. 4, 1985, now U.S. Pat. No. 4,806,921.

BACKGROUND OF THE INVENTION

1. Field of the Invention

The invention relates to the field of converting digital data representing figures or objects into a pixel-like display for use in a pattern generator.

2. Prior Art

The present invention has its origin in the generation of patterns used in the fabrication of integrated circuits. With today's very large scale integrated circuits, hundreds of thousands of transistors are fabricated on a single die. Each layer of the circuit may require upwards of millions of figures (such as rectangles, triangles, etc.) to define circuit elements such as gate structures, diffusion patterns, interconnects and others. Numerous technologies are available for generating these patterns for the fabrication of masks or for directly exposing photoresist on a semiconductor wafer. Electron beam lithography, for instance, is one technology currently in use for generating patterns.

The rasterizer of the present invention receives data representing figures or objects and then provides the pixel-like representation of the figures. The pixel memories are scanned and their outputs used to control laser beams which themselves scan a workpiece, such as a photoresist layer on a semiconductor reticle. Because of the millions of bytes required to define even a single die of a complex circuit, prior art methods for generating patterns on a real time basis are too slow or too costly. As will be seen, the present invention provides an apparatus for rapidly and efficiently providing such patterns.

The rasterizer of the present invention is based on an 8×8 array which takes advantage of the architecture found in many commercially available dynamic random-access memories. The closest prior art known to Applicant is described in "The 8×8 Display", *ACM Transactions on Graphics*, Vol. 2, No. 1, January 1983, pages 32–56 by Sproull, Sutherland, Thompson, Gupta, and Minter. As will be seen, the present invention provides faster, more efficient processing through unique circuitry over that described in this article.

SUMMARY OF THE INVENTION

An apparatus for generating a pixel pattern from data representing predetermined geometric objects such as rectangles and triangles is described. The apparatus includes a plurality of image generators which receive the data in a geometry memory (also referred to as pass memory) and then rasterize the data placing it into a pixel memory. While one pass memory is being loaded from a first bus, the pixel memory associated with another one of the generators is raster scanned onto a high speed digital video bus.

The pixel memory comprises a plurality of dynamic random-access memories in the currently preferred embodiment. An 8×8 array of 64k memories is used. The data representing the geometric objects are used to generate address signals which are coupled to all of the DRAMs. Some of the position and dimension data for the objects are used to determine limits within the pixel memory into which the objects are to be written. These limits control access to the DRAMs through column address strobe (CAS) and row address strobe (RAS) decoders. Also, particularly for the generation of triangles, the write enable control lines to each of the memories are separately controlled by a write enable generator to define pattern areas. The DRAM memory 8×8 addresses for the origins of the objects are computed and then incremented by counters to allow the objects to be "filled in" in the pixel memory. A common data line is coupled to all of the DRAMs and the binary state on this line determines whether the objects will be clear or dark.

The rasterizer of the present invention provides data at peak rates of 55 megabytes per second (in typically 50% duty cycle bursts).

Other aspects of the present invention will be apparent from the detailed description.

DETAILED DESCRIPTION OF THE PRESENT INVENTION

Introduction

A rasterizer is disclosed for use in a pattern generator system. The rasterizer is particularly useful in the generation of patterns used in the fabrication of photolithographically formed patterns in integrated circuits. In the following description, numerous specific details are set forth such as specific memory sizes, data rates, etc., in order to provide a thorough understanding of the present invention. It will be obvious, however, to one skilled in the art that the present invention may be practiced without these specific details. In other instances, well-known structures and circuits have not been set forth in detail in order not to unnecessarily obscure the present invention.

The rasterizer of the present invention is used in conjunction with a laser optical system which defines patterns in a photosensitive layer for making masks or directly writing onto a semiconductor wafer. The digital video data from the rasterizer determines whether a pixel location on the photosensitive layer will be exposed or remain unexposed.

The amount of video data required to define an integrated circuit is very large. The data must be rapidly delivered by the rasterizer if the patterns are to be defined in a reasonable period. To appreciate the enormity of the problem, consider a case where the laser beams are directly exposing a photoresist layer on a reticle where the size is 2.0×2.0 inches. It takes approximately $1.25 \times 10^9$ bytes of pixel data to define geometries for a single placement on the reticle. When one considers the number of placements on a reticle, the amount of pixel data required becomes enormous. As will be seen, the rasterizer of the present invention delivers data at extremely fast rates in real time.

Overview of the System

Figure 2:
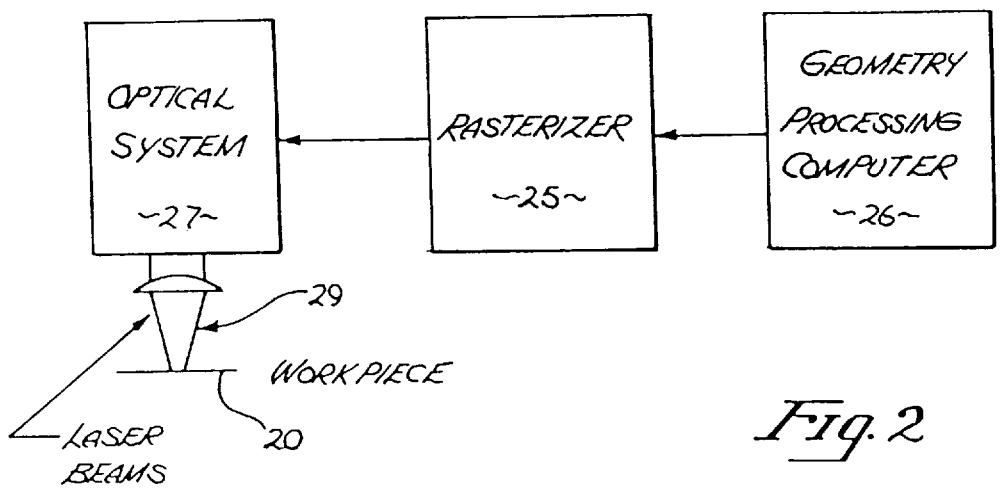
FIG. 2 is a block diagram showing the rasterizer of the present invention with other major components used in the generation of patterns on a workpiece.

The system in which the rasterizer of the present invention is used is generally shown in FIG. 2. The optical system 27 receives video data from the rasterizer 25 and through a rotating mirror, mechanically scans a workpiece 20. Eight laser beams 29 are selectively controlled by the digital data from the rasterizer 25 to define patterns on the photosensitive material deposited on workpiece 20. The optical system 27 as described in copending application Ser. No. 867,205 entitled "LASER PATTERN GENERATION APPARATUS", filed May 27, 1986 and assigned to the assignee of the present invention which is a continuation of application Ser. No. 758,344 entitled "LASER PATTERN GENERATION APPARATUS", filed Jul. 24, 1985, assigned to the assignee of the present application, now abandoned.

Figure 1:
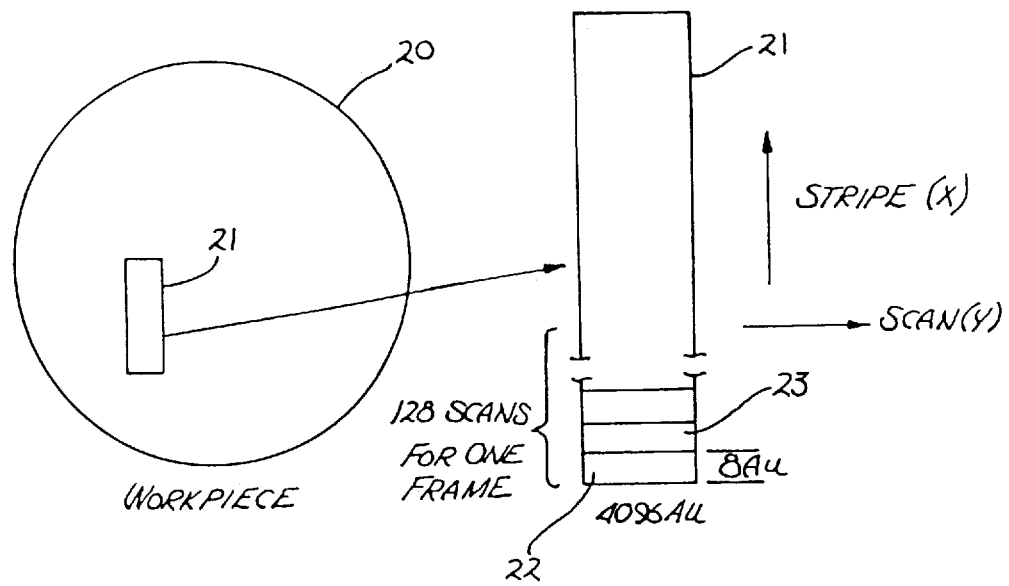
FIG. 1 is a diagram used to illustrate a single frame of pixel data and its relationship to a pattern on a semiconductor reticle.

Referring to FIG. 1, the workpiece 20 is again illustrated. The optical system prints in rectangular passes 21. Each pass includes a plurality of frames. Each frame comprises 128 scan lines such as lines 22 and 23. Each scan line is 8 beams wide and is printed in 125 microseconds or greater. The time of printing depends on the rate of rotation of the mirror. Thus, each frame requires 16 milliseconds or greater. Each scan is 4096 address units in width and 8 address units in height. That is, there are 32K bits of data per scan, or viewed in another way, there are 32K pixels per scan. Each pixel memory of the rasterizer stores one frame of pixel data, that is, approximately 0.5 megabytes of data. The 4096 address units of each scan are typically equivalent to 2048 microns in the scan direction. (Note that in FIG. 1 the X and Y directions are not in their usual orientation. This orientation was chosen to provide consistency between the orientation described in the above-mentioned pending application and the orientation used in the remainder of this application.)

The pattern delivery computer 26 of FIG. 2 receives conventional data defining patterns and converts it to the format used by the rasterizer 25. Typically in the fabrication of a semiconductor device, each level is "digitized" to delineate the objects on that level. This data, for instance, may set out the location, size and orientation of a trapezoid or other geometric object. Computer 26 converts this data into two geometric objects, rectangles and triangles. The rasterizer 25 operates on this converted data (e.g., rectangles and triangles) forming pixel data which drives the optical system 27.

Formatting Provided by the Pattern Delivery Computer

In the currently preferred embodiment, the pattern delivery computer 26 is a commercially available Masscomp computer. The computer is linked to the rasterizer through a standard DMA channel link (DR-11W link). The data defining the patterns is communicated to computer 26 in a standard format such as Electron Beam Engraving System (EBES). This data is then converted to a format and size acceptable to the rasterizer 25. In the currently preferred embodiment, as mentioned, the rasterizer operates on two geometric figures, rectangles and triangles. Other geometric figures are obtained by combining the rectangles and triangles. The triangles are right triangles, however, they can be drawn in one of four orientations.

Referring to FIGS. 9a–9d, four 16-bit words are used to delineate each geometric object (this is sometimes referred to as pattern data). Bracket 92 faces four words 93, 94, 95, and 96 which define object 98. The first bit of word 93 labeled "TONE" determines whether the object is dark or light. A zero in this position causes the rasterizer to write ones into the pixel memory. The second bit is a control bit and informs the rasterizer whether a geometric object is being transmitted or whether the four words are for control purposes. The remainder of word 93 represents the height (H-1) of the geometric object. The first bit of word 94 specifies the object as a triangle or a rectangle. A zero in this position indicates a rectangle whereas a one indicates a triangle. The next two bits of word 94 determine the orientation of the object. A decimal one indicates the object is formed to the northwest of its origin; a decimal two, southeast, etc., (note rectangle 98 extends to the northeast from its origin). Words 95 and 96 indicate the X and Y starting point (origin), respectively, for the object. These are the coordinates of the object within each pass. (The pattern delivery computer provides 0.5 megabytes of data to one of several pass memories in the rasterizer as will be seen. The size of the pass on the workpiece can vary depending on the complexity of the objects contained within that pass. Typically, numerous frames of pixel data are generated from the data in each pass memory.)

Bracket 100 encompasses four words which define object 101. Note that the second and third bits of the second word (00) result in a triangle with a hypotenuse facing northeast.

Bracket 103 encompasses four words which define object 104. The object 104 illustrates that the height and width may be "negative" from the origins. The orientation bits determine this. As will be seen later, this orientation determines whether certain counters are incremented or decremented.

Thus, to summarize the geometry processing computer 26 accepts data representing objects in a standard format and converts it to the format shown in FIGS. 9a–9d. Larger, complex figures are broken into a plurality of rectangles and triangles and it is these rectangles and triangles which are rasterized by rasterizer 25 for delivery to the optical system.

Block Diagram of the Rasterizer

Figure 3:
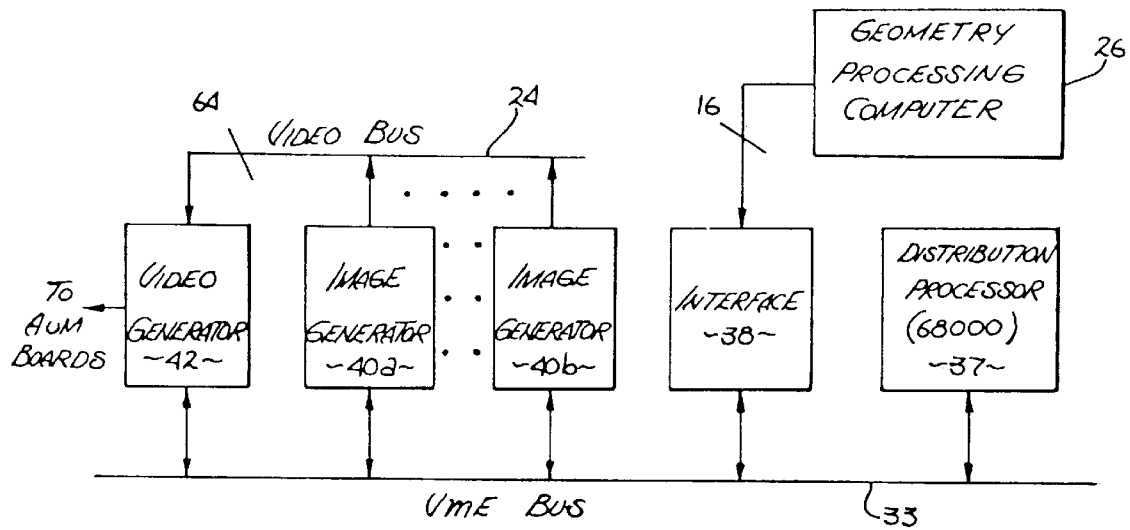
FIG. 3 is a block diagram showing the rasterizer of the present invention.

In the block diagram of FIG. 3, the link between the geometry processing computer 26 and the rasterizer is shown specifically coupling the computer 26 to the interface unit 38. The interface unit 38 is a standard interfacing component to provide interface between the DMA channel link and the standard VME bus 33. The bus 33 communicates with a processor 37 which controls distribution of data and provides other housekeeping functions. In the currently preferred embodiment, a 68000 microprocessor is used for the processor 33. The VME bus 33 communicates with a plurality of image generators 40 (40a and 40b are shown) and the video generator 42. The image generators provide video data (pixel data) to a video bus 34 which couples this data to the video generator 42. As will be seen, the video generator 42, among other functions, converts the data from the time base of the rasterizer to the time base used by the optical system. The video generator 42 provides the data to the acousto-optical modulator data boards housed with the optical system.

The image generators convert the pattern data from computer 26 to the pixel data. A plurality of image generators 40 are used (typically three) to permit continual transmission of the pixel data. The image generators 40 rasterize one frame of rectangles and triangles and then transmit this data to the video generator. Normally, two image generators are rasterizing while one transmits pixel data. At each frame boundary the image generator which is transmitting data begins again rasterizing data, while another image generator begins transmitting data. The data from the VME bus 33 is sequentially written into the geometry memory or pass memory 44 (FIG. 4) of the image generators.

After initialization, computer 26 loads the first pattern data into the 0.5 megabyte pass memory of one of the image generators. Frame boundaries delineate the end of frame data. Generally, the data for a single pass is loaded into one of the pass memories. In some cases, for complex geometries it may be necessary to load a pass memory more than once to generate a single frame or stripe. To facilitate multiple geometry loads of the pass memory for a single frame or stripe, an End-of-Subframe signal (control command) is used. This permits any pattern to be rasterized regardless of complexity or density. Upon encountering the End-of-Subframe signal, the image generator will set a bit in its status register and interrupt the flow from computer 26 to request additional data.

In a typical situation, the pass memory in each of the image generators contains sufficient data for numerous frames. Each generator rasterizes its next frame's pixel data in real time.

In some cases, two banks of three image generators are used with two video generators.

Image Generator

A. Block Diagram

Figure 4:
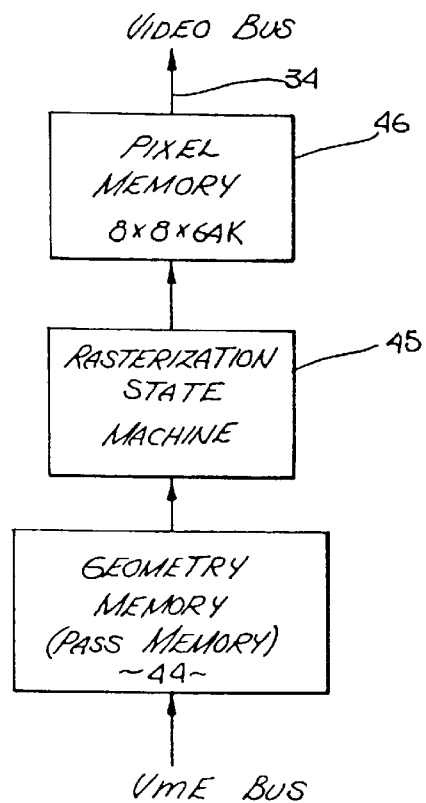
FIG. 4 is a block diagram of an image generator used in the rasterizer of FIG. 3.

In FIG. 4 an image generator such as image generators 40a and 40b of FIG. 3 is illustrated as having three major components, the geometry or pass memory 44, the rasterization state machine 45 and the pixel memory 46. The rasterization state machine provides the writing instructions for the pixel memory 46, and, in effect, fills in the geometric objects for the pixel memory. The state machine, as will be seen, uses a plurality of counters along with other control signals to write the data into the pixel memory. The logic for this state machine is implemented in PALs. The control performed by these PALs insofar as used in the present invention is described in subsequent figures. The pixel memory 46 comprises an 8×8 array of 64K dynamic, random-access memories (DRAMs).

Figure 5:
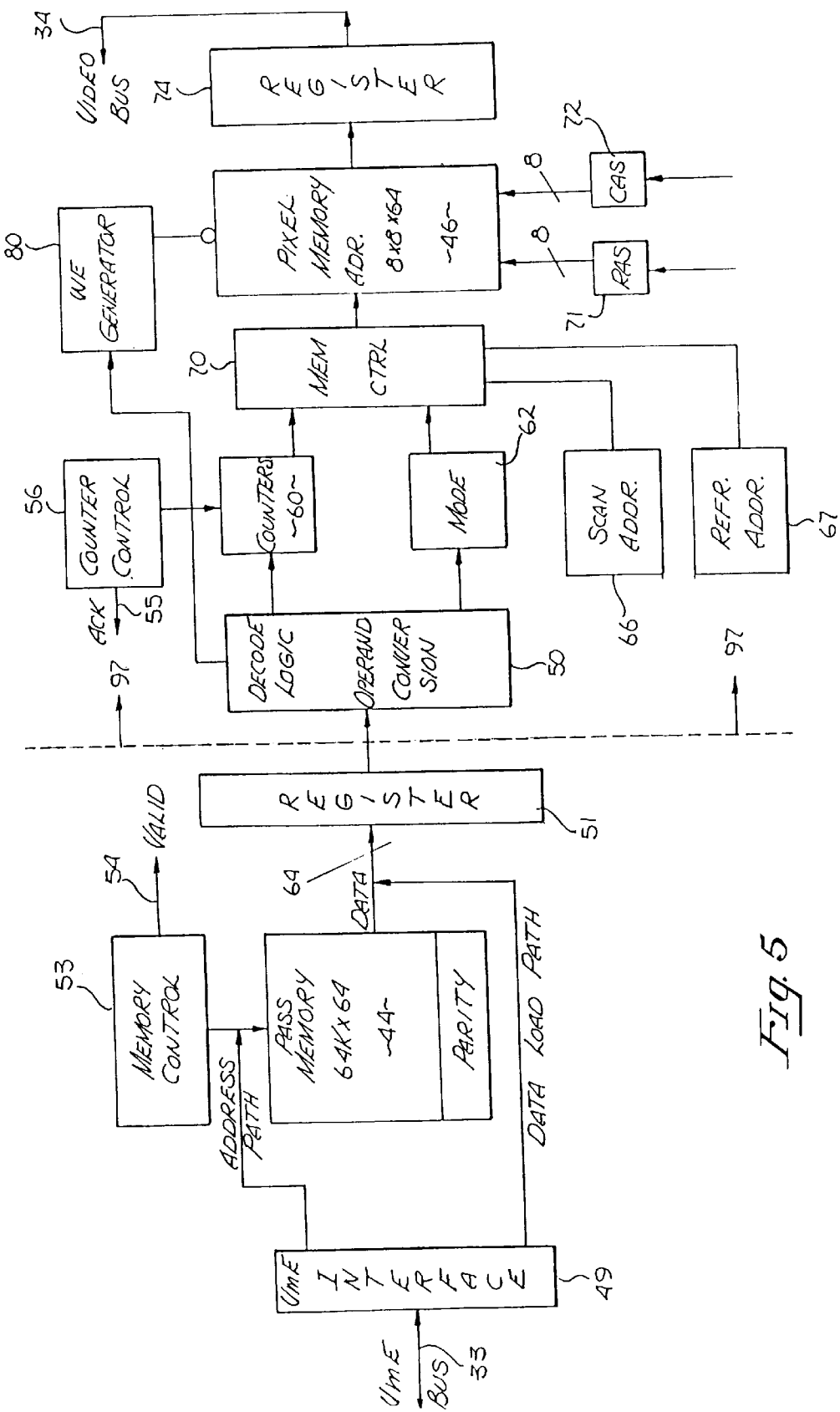
FIG. 5 is a more detailed block diagram of the image generator of FIG. 4 which shows the overall functions performed by the various components in the image generator.

The rasterizer 40 is represented in FIG. 5 with numerous functional blocks. The state machine and pixel memory are shown to the right of the line 97.

The data from the VME bus 33 is coupled to an interface circuit 49 in FIG. 5. As presently implemented, 16 lines of bus 33 are used for data, 24 for address and several others for control and power signals. The computer 26 provides the address signals needed to load the pattern data into the memory 44. Both the address path and data path are shown in FIG. 5. Parity bits are also stored within the memory 44 and a parity checking circuit (not illustrated) is used to ensure the integrity of the data delivered to the memory 44. The memory control 53, in addition to providing normal control functions to memory 44, provides valid signals on line 54 and receives acknowledge signals on line 55 for the transfer of each 64 bits to the state machine via register 51. These bits represent the data defining a geometric object as shown in FIG. 9.

The decode logic/operand conversion unit 50 converts the data from register 51 into a format that can be directly evaluated by the state machine. This conversion is described in conjunction with subsequent figures. A plurality of counters 60 (shown in subsequent figures such as FIGS. 6 and 7 as counters 82 and 83) provide addresses for the pixel memory 46. The counter control 56 includes the PALs previously mentioned which control the counters and implement certain algorithms which are set forth later.

The mode control 62 illustrates that the memory operates in several different modes. For instance, the memory is loaded under control of the state machine. Then scan line addresses from the scan addresser 66 are generated when the pixel data is read from the memory onto the video bus. The scanned pixel data from the pixel memory 46 is passed through the register 74 onto the 64-bit wide video bus 34. Refresh addresses are also generated by the refresh addresser 67 to permit refreshing. The memory controller 70 selects between these various modes and provides arbitration, for instance, when refresh is needed. The row address strobe (RAS) is generated by the decoder/generator 71 and the column address strobe (CAS) signal is generated by the decoder/generator 72. These decoder/generators are subsequently discussed. As will be seen, they provide address-like information which limits the memories into which information can be written for a particular object. Memories are also selected within the pixel memory 46 by the write enable (WE) generator 80. This unit is also discussed in conjunction with subsequent figures.

B. Organization of the Pixel Memory

Figure 7:
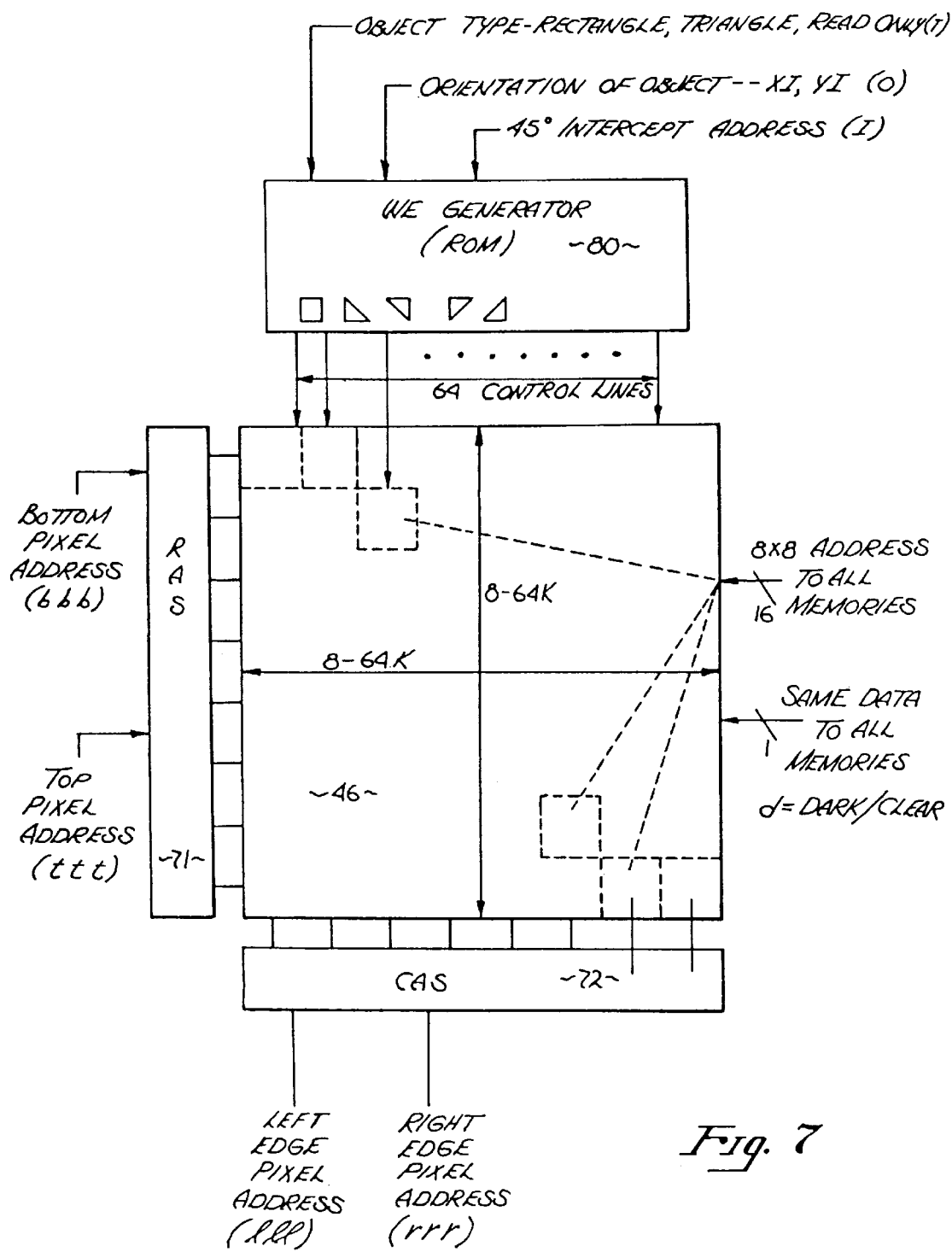
FIG. 7 is a block diagram primarily of the pixel memory and WE generator of the image generator.

Referring to FIG. 7, the pixel memory comprises an 8×8 array of 64K DRAMs. (256K or larger DRAMs can also be used, as will be apparent from the discussion which follows.) These commercially available DRAMs require a RAS signal for the memories to accept a row address. Similarly, a CAS signal is needed for the memories to accept a column address. If either of these signals is not present, the memory is, in effect, disabled from writing since it does not have a complete address. Also, each memory requires a write enable (WE) signal when data is to be written into the memory. All 64 of the 64K memories are coupled to a common address bus and thus each receives the same 8×8 address. Similarly, all the data lines from the memories are coupled to a common data line and each receives the same data. The data determines whether a dark figure or clear figure is written and this information is derived directly from the "TONE" data provided from the pass memory. The RAS decoder/generator 71 decodes information received from the operand conversion unit 50 and provides a strobe signal to the memories along one or more rows in the memory array. Similarly, the CAS decoder/generator 72 provides strobe signals along one or more of the eight columns of memories within the array. The RAS decoder 71 and CAS decoder 72 are thus used to select certain of the memories within the memory array.

Each memory stores one of the 64 pixels for every 8×8 address for each of the 65,536—8×8 addresses in a frame.

The RAS decoder 71 receives two addresses, one indicating the top pixel to be written for a particular object (ttt)

and the bottom pixel to be written for a particular figure (bbb). These addresses are directly derived from the height, width and position data provided to the operand conversion unit 50. The RAS decoder 71 then provides a strobe signal to those DRAMs which fall within these addresses. The CAS decoder 72 receives an address indicating the left edge of the figure (lll) and the right edge of the figure (rrr). These indices determine which ones of the memories are to receive the column strobe. The RAS and CAS decoders are used for other normal functions, for instance, during refreshing, all lines from the RAS decoder are activated.

The addresses provided to the memory 46 are "mapped" to permit storage of data in the frame width described in conjunction with FIG. 1. (In each 8×8 address there are 9 y-address bits and 7 x-address bits.) Also, for best performance the row-column order used to traverse the body of geometric objects should be aligned with the most opportune pixel memory organization. That is, the 64K DRAMs in the pixel memory should have their fastest varying axis aligned with the axis used to read the pixel memory during the scanning of the memory. This fastest axis is specified by the manufacturer and referred to as "page mode", "ripple mode", "static column", etc.

The WE generator 80 comprises a plurality of read-only memories. The generator receives as an address data indicating the object type (i.e., rectangle or triangle) (T); orientation of the object (O), and in the case of a triangle, the 45 degree intercept address (I). All of these are obtained from the operand conversion unit 50. Each of the 64 memories are coupled by a separate line to the WE generator 80. When writing rectangles, all of the memories receive the same write enable signal. For triangles, the WE generator determines which of the locations are to be written. This function will be described later.

Figure 6:
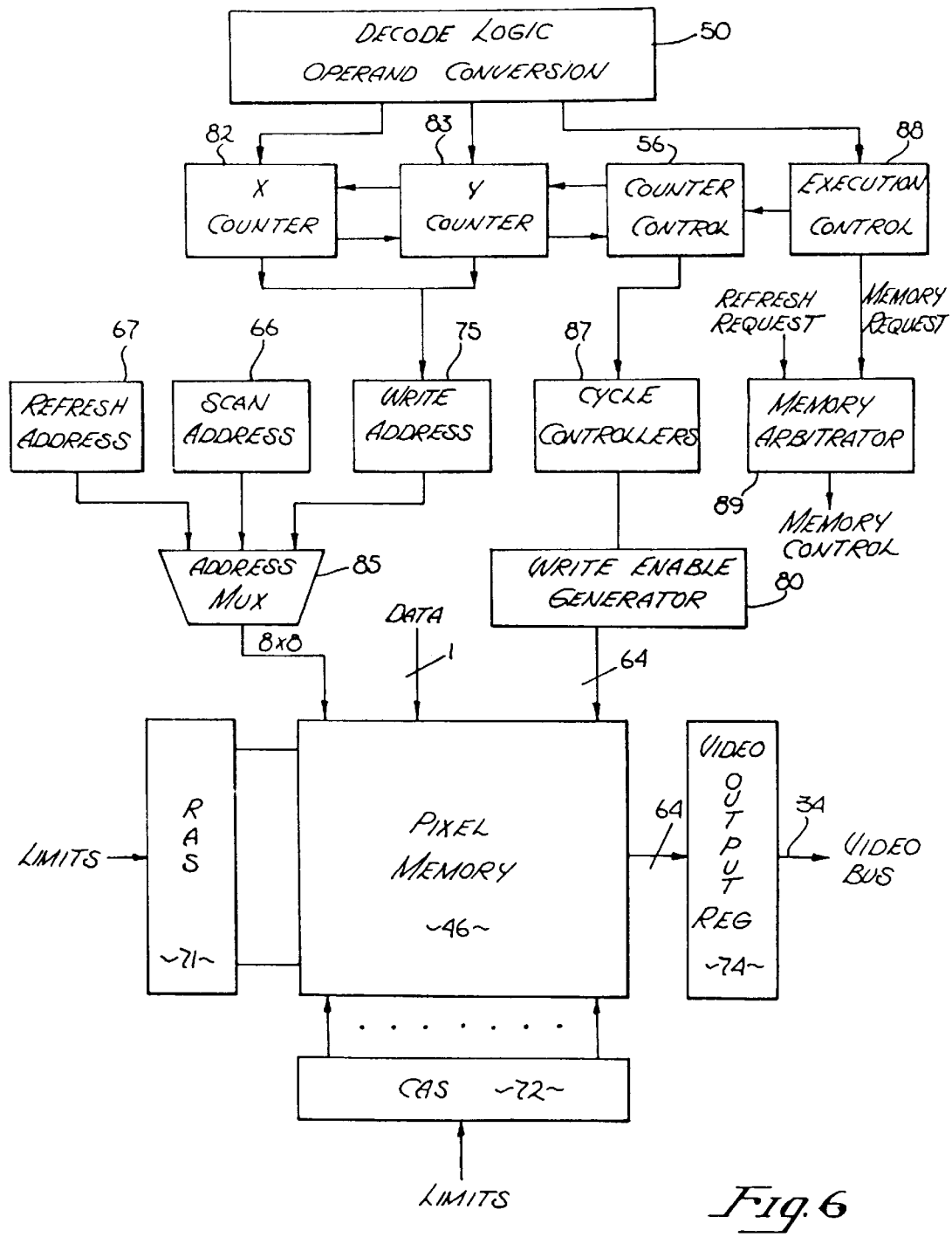
FIG. 6 is a block diagram of a portion of the image generator.

In FIG. 6, the next level of detail is shown for the state machine and its coupling to the pixel memory. The 8×8 addresses used for loading the pixel memory are derived from counters 82 and 83. The counts in these counters provide the write address as shown by unit 75. Counters 82 and 83 will be described in detail in conjunction with FIG. 8.

The scan address unit 66, as mentioned, is used when data is read from the pixel memory. This unit provides raster-like addresses for reading the pixel data onto the video bus 34. The refresh address unit 67 provides the refresh addresses. This is used in conjunction with the memory arbitrator 89 to determine when refreshing is necessary, and in some cases, may require overriding of other functions. The multiplexer 85 selects one of the addresses from units 66, 67 or 75. The execution unit 88, along with the counter control 56, control the counters, the cycle controllers 87 and the memory arbitrator 89. Insofar as these functions are significant to the present invention, they are set forth in more detail in connection with FIG. 8.

C. 8×8 Address Generation

Figure 8:
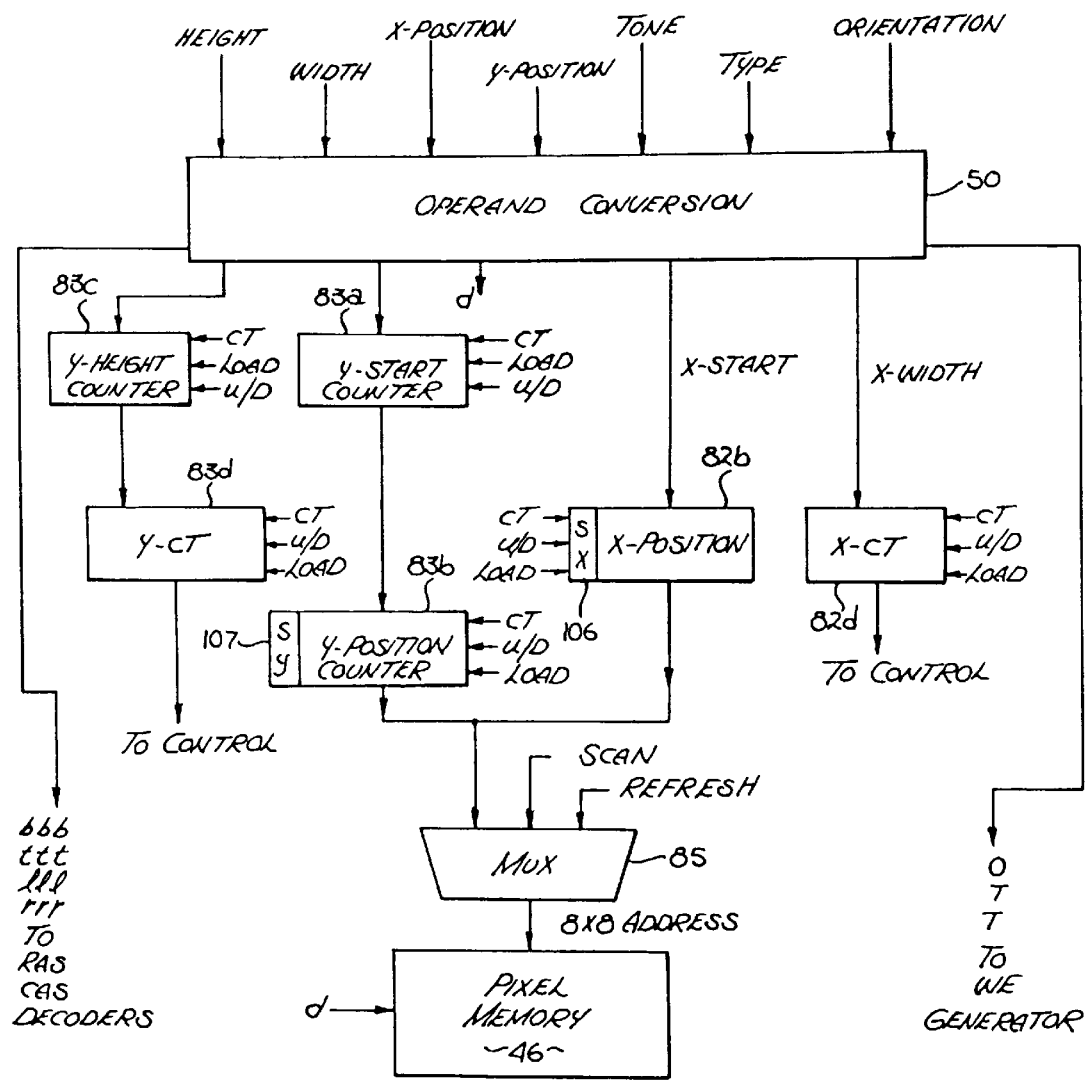
FIG. 8 is a block diagram primarily of the counters of the image generator.
Figure 9A:
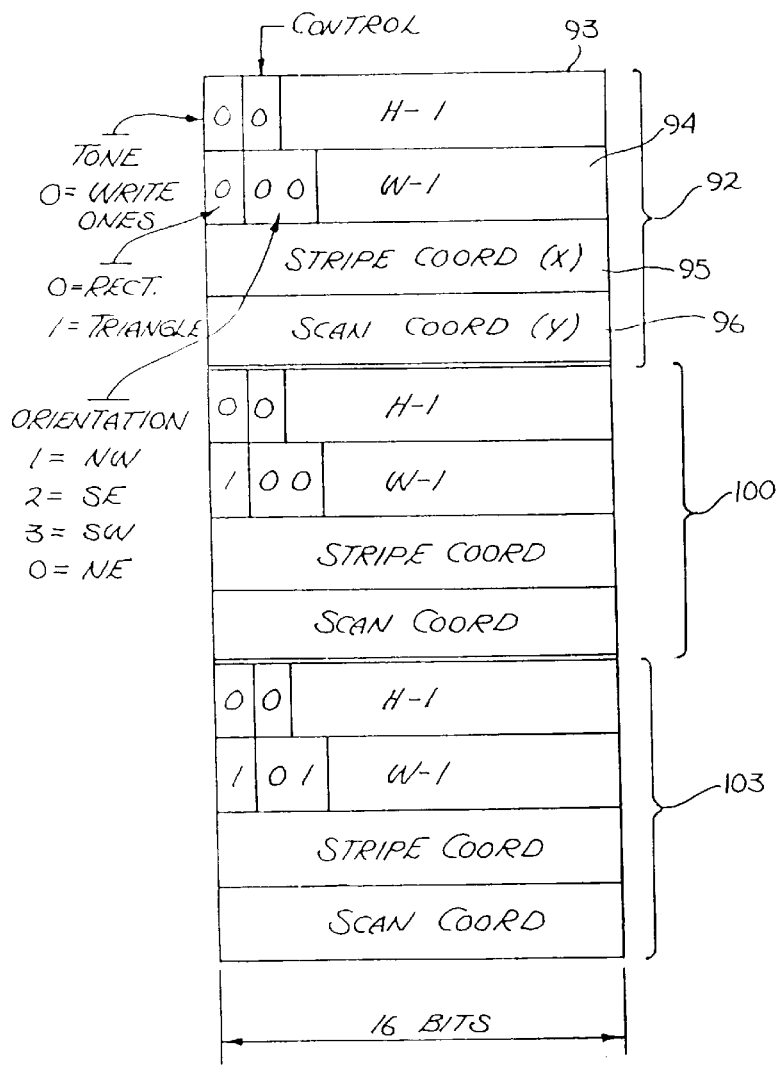
FIGS. 9a–9d are diagrams used to show the data formatting used in the presently preferred embodiment of the invention.
Figure 9B:
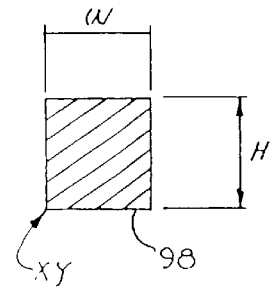
Figure 9C:
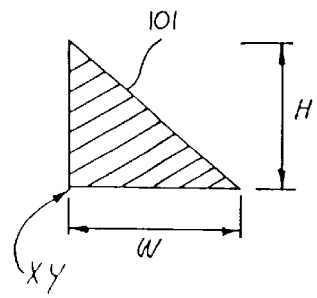
Figure 9D:
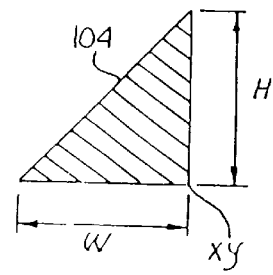

The counter 82 of FIG. 6 is shown as including an x-position counter 82b and an x-counter 82d in FIG. 8. The Y counter 83 of FIG. 6 comprises the y-start counter 83a, y-position counter 83b, y-height counter 83c, and a y-counter 83d. The counters 82 and 83 operate as two nested loops which traverse the rows and then the columns of the area which entirely contains an object which is filled-in within the pixel memory. The geometric bounding parameters are based on an 8×8 memory boundary. The Y counter and X counter track the address and the number of rows/columns that are to be written. These addresses are indicia for the array of 8×8 regions of the pixel memory. The data supplied to the operand conversion unit 50, specifically height, width, x-position, y-position, tone, type and orientation are converted to a starting x-position and a starting y-position which are loaded into counters 82b and 83a. The x-width is loaded into counter 82d and the y-height into counter 83c. For each x-position, all the corresponding y-positions are written into. First, the y-start position is transferred into the x-position counter 83b and this counter is incremented for the y-height stored in counter 83d. Then the x-position counter 83b is incremented and all the y positions for this new x position are addressed and filled in. This is done as shown by the following:

---

State Machine Sequence (xStart,yStart,xCols,yRows,type,orientation)
INT xStart,yStart,xCols,yRows,type,orientation;
xPos=xStart;
yPos=yStart;
for (xCt=xCols; xCt>0 ; xCt--)
(
    for (yCt=yRows ; yCt>0 yCt--)
    (
        write8X8 (xPos,yPos) '
        nexty(yPos,orientation) ;
    ) ;
    nextx(xPos,orientation) ;
) ;
);

---

The state machine logic configures the address counters either in the up or down direction so that rasterization can occur in one of four mirrored orientations of any geometric object: x+y+, x+y−, x−y+, x−y−. The U/D signal to the counters controls this orientation.

As also shown in FIG. 8, the operand conversion unit 50 provides the bottom, top, left and right signals to the RAS and CAS decoders and the object type (T) orientation (O) and 45 degree intercept address to the WE generator 80 (I).

D. Scissoring

Normally, the state machine only interprets objects which are written entirely within the pixel memory. One special situation is considered; that of instances where the geometry data is partially outside the frame being rasterized. A different portion of the geometry must be written into each of the image generators and the remainder ignored.

The state machine contains a scissoring mode which addresses this problem. In the scissoring mode, the state machine adds one additional high order bit to the 8×8 address for each axis. This is shown as bit 106 for counter 82b and bit 107 for counter 83b. The extra bits are loaded with the next higher order address bit from the original geometric object descriptor. When the state machine is operated in the scissor mode, the state machine sequences an object in the manner described above, but write cycles to the pixel memory are only performed when SX=0 and SY=0. Thus, the state machine "scissors" those portions of the object which do not fall within the boundaries of the pixel memory. Objects which are incorrectly specified are therefore foreshortened. Objects which need to be clipped as a result of translation are scissored by the state machine. Status information in the image generators allow the distribution processor 38 of FIG. 3 to determine whether scissoring is required for any of the items in a frame.

When an image generator is not in the scissor mode, SX and SY are loaded with zeroes each time a new figure is evaluated and write cycles to the pixel memory are always enabled. Effectively, the state machine will interpret the geometric values X(9:0), Y(11:0) as (9:0), and H(11:0). The additional bits of X(15:10) and W(15:10) are ignored.

E. Operand Conversions

One conversion performed by the operand conversion unit 50 requires the computing of the number of rows/columns of 8×8s which must be written and the pixel memory addresses for the top, bottom, left, and right pixels at the extremities of the object. These values are computed from the data shown in FIG. 9. The computations are identical for the x-axis/width or the y-axis/height, only the x-axis computation is described below.

First, the northeast orientation of an object is discussed. Given the x address of the origin of the object and a width, both expressed in the address units of FIG. 9, the number of 8×8s along the x-axis may be computed. (// represents integer division, W(9:3) represents a subfield of the width of the original object.)

$$\text{x-writes(NE)}=((W[9:0]+X[2:0])//8)+1$$

Rearranging terms:

$$\text{x-writes(NE)}=((W[9:0]+X[2:0])+8)//8$$

$$\text{x-writes(NE)}=W[9:3]+((W[2:0]+X[2:0]+8)//8)$$

Similarly, the northwest orientation of the same object requires slightly different computation:

$$\text{x-writes(NW)}=((W[9:0]-x[2:0]+7)//8)+1$$

$$\text{x-writes(NW)}=(W[9:0]-x[2:0]+15)//8$$

$$\text{x-writes(NW)}=W[9:3]+((W[2:0]-x[2:0]+15)//8)$$

Furthermore, the pixel-address of the opposite edge of the object may be computed:

$$\text{x-end(NE)}=(x[2:0]+W[2:0]) \text{ MOD } 8$$

$$\text{x-end(NW)}=(x[2:0]-W[2:0]) \text{ MOD } 8$$

All of these equations are evaluated in a lookup table (a ROM which is part of the conversion unit 50). The inputs to the ROM are x[2:0], W[2:0], and the orientation O[0] (O[0]=0 implies x+, O[0]=1 implies x−). The ROM generates the value x-end [2:0] and a single bit x-extra which controls the carry to a separate incrementer which computes:

$$\text{x-writes}=W[9:3]+\text{x-extra}$$

$$\text{x-extra(NE)}=((W[2:0]+x[2:0]+8)//8)$$

$$\text{x-extra(NW)}=((W[2:0]-x[2:0]+15)//8)$$

F. WE Generator

The WE generator is fabricated from 74S472 (512×8) PROMs. The specific code used to generate the signals described below is contained in table A. The inputs to each of the PROMs are:
O[1:0] Orientation of the object, I[0]=x+, I[1]=y+
T[1:0] Object Type: Rectangle, Triangle, ReadOnly
I[3:0] 45 Degree Intercept address For rectangles, the WE generator activates the WE outputs to 64 DRAMs. For triangles, the WE generator computes appropriate on of memories which are on one side of the defining 45 degree for one of the four allowed orientations.

The 45 degree intercept address I[3:0], selects one of the 15 possible positions which the 45 degree side of a triangle may assume. Two examples are shown below, one for I[3:0]=5 and another I[3:0]=11. The asterisks indicate write enables for DRAMs in 8×8 organization which may need to be written to form the object's 45 degree edge.

| | | | | | | | | |
|---|---|---|---|---|---|---|---|---|
| 14 | | | | | | | | |
| 13 | | | | | | | * | |
| 12 | | | | | | * | * | |
| 11 | | | | | * | * | * | |
| 10 | | | | * | * | * | * | |
| 9 | | | * | * | * | * | * | |
| 8 | | * | * | * | * | * | * | |
| 7 | 6 | 5 | 4 | 3 | 2 | 1 | 0 | I[3:0]=5 |
| 14 | | | * | * | * | * | | |
| 13 | | * | * | * | * | * | * | |
| 12 | | * | * | * | * | * | * | |
| 11 | * | * | * | * | * | * | * | |
| 10 | * | * | * | * | * | * | * | |
| 9 | * | * | * | * | * | * | * | |
| 8 | * | * | * | * | * | * | * | |
| 7 | 6 | 5 | 4 | 3 | 2 | 1 | 0 | I[3:0]=11 |

The 45 degree intercept address is computed from the pixel address of the vertex of the triangle. The vertex address x[2:0], y[2:0] is specified by six bits which are reencoded into a four-bit intercept address. This conversion is performed by a PROM whose inputs are:
x[2:0] x pixel address
y[2:0] y pixel address
O[1:0] orientation
p selects original/alternate pattern
and whose output is I[3:0], the intercept number. Relative to the 8×8 which contained the vertex that defined the original intercept address, the intercept address alternates between two values for each column crossed in the direction and for each row crossed in the y direction.

Figure 11:
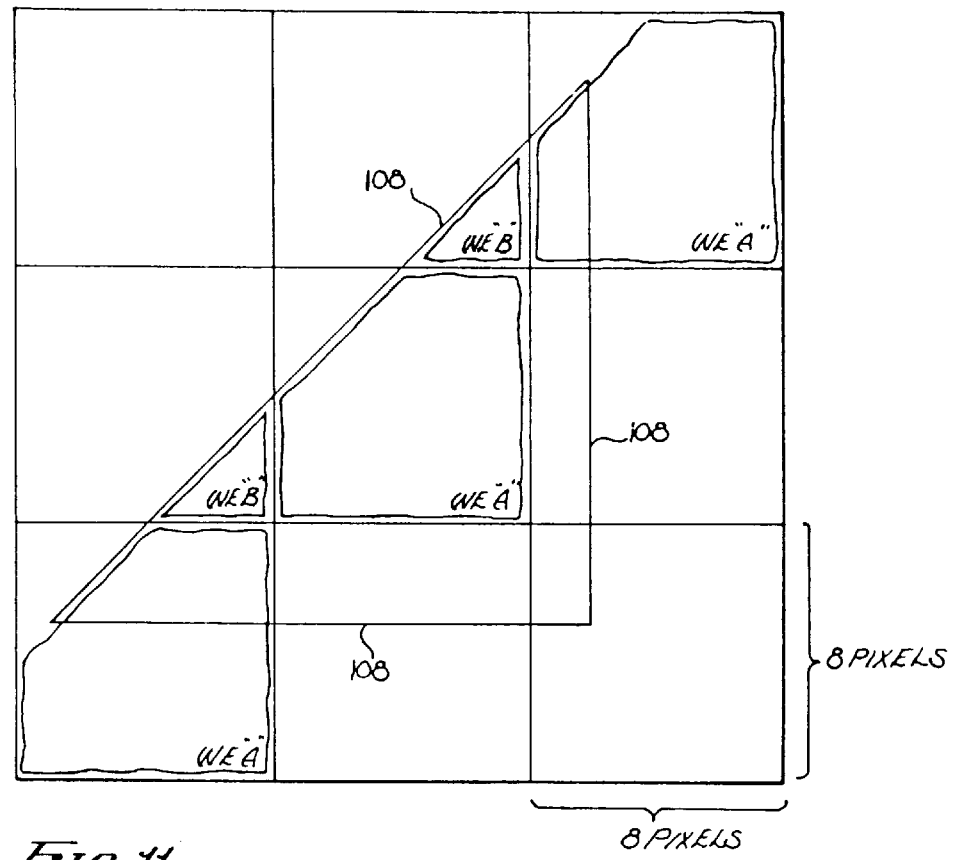
FIG. 11 is a diagram used to describe the operation of the write enable generator.

FIG. 11 illustrates the two distinct WE patterns which are required to write the 45 degree edges of the triangle 108. Consider the WE "A" pattern in the lower left corner of the triangle to be a defining pattern for the 45 degree edge. Notice that there is an alternate to the WE "B" pattern to construct the 45 degree edge that is one row above the original 8×8 cell; but the same WE "A" pattern is used for the cell which is one row above and one column to the right of the original cell. If the manhattan distance in rows and columns from the original cell to the current cell is odd, the WE pattern is alternated. If the manhattan distance is even, the same WE pattern is used. This parity function is easily computed, given the original X, Y 8×8 address and the X', Y' address of the new cell to be written:

$$(P=(X[0] \text{ XOR } X[0]') \text{ XOR } (Y[0] \text{ XOR } Y[0]')).$$

Referring to Table A, page 1, the input address is shown in the left hand column. The rectangle field (when all WE lines are activated) is shown by the rectangle symbol (upper left). The triangle field is shown by the triangle symbol (upper right). The read-only and NOP are part of the scissoring mode. The lower half of each ROM contains the "NO WRITE" field.

G. Typical Cycles to Generate a Figure

Figure 12:
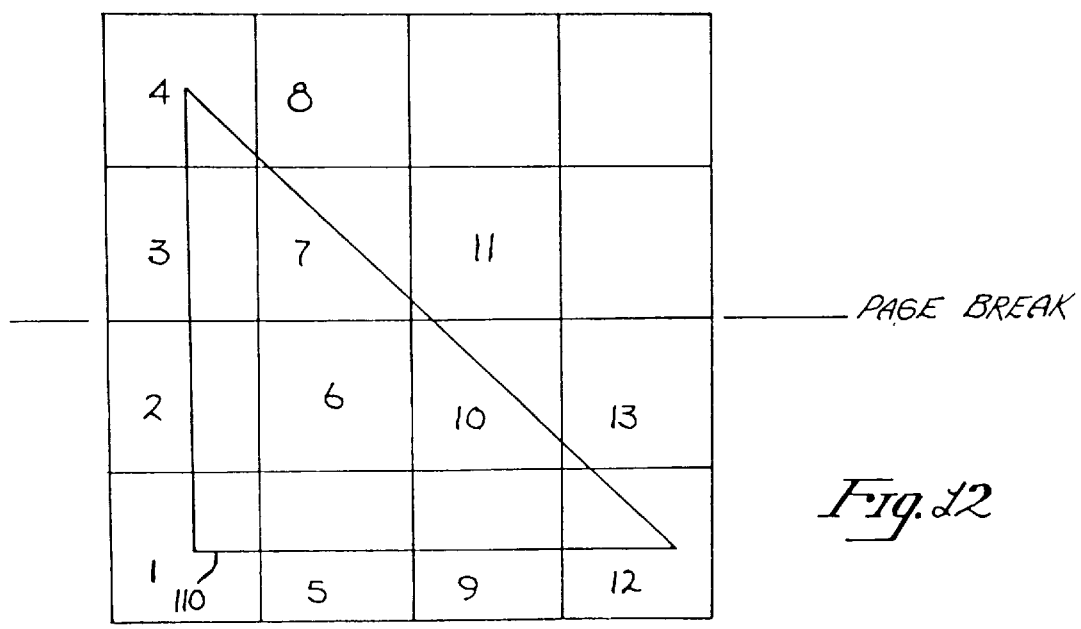
FIG. 12 is a diagram used to illustrate typical number of cycles required in the rasterization process.

In FIG. 12, a triangle 110 is shown against a grid. Assume that this triangle is to be written into the pixel memory. The following order referring to the block numbers in FIG. 12 is used:

| No. of Cycles | | |
|---|---|---|
| 1 | RAS | to start  8x8  block 1 |
| 2 | CAS | to do      8x8  blocks 1 and 2 |
| 1 | RAS | at page break between blocks 2 and 3 |
| 2 | CAS | to do      8x8's blocks 3 and 4 |
| 1 | RAS | for new page at #5 |
| 2 | CAS | to do blocks 5 and 6 |

-continued

| No. of Cycles | | |
|---|---|---|
| 1 | RAS | page break between blocks 6 and 7 |
| 2 | CAS | to do blocks 7 and 8 |
| 1 | RAS | for new page at block 9 |
| 2 | CAS | to do blocks 9 and 10 |
| 1 | RAS | page break between blocks 10 and 11 |
| 1 | CAS | to do block 11 |
| 1 | RAS | new page at block 12 |
| 2 | CAS | to do blocks 12 and 13 |

As can be seen from above, 20 cycles are required, 13 of which are used for performing writes.

Video Generator

Figure 10:
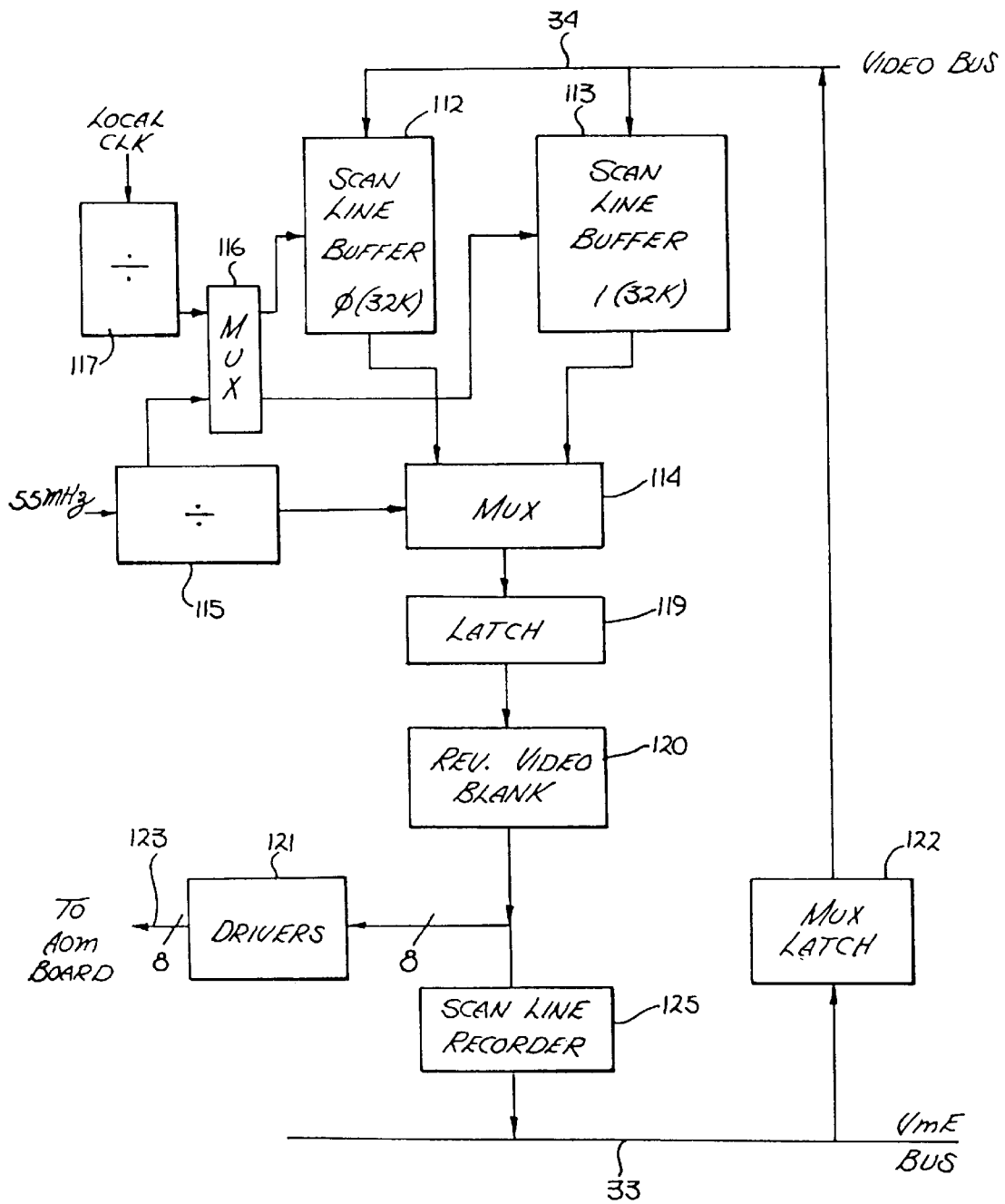
FIG. 10 is a block diagram of the video generator of FIG. 3.

In FIG. 10, the video generator receives the pixel data from the image generators at either buffer 112 or buffer 113. The selection of the buffers is controlled so that one buffer is being loaded from the video bus while the other is being unloaded to the output line 123 through the multiplexer 114 latch 119 and reverse video blanking circuit 120. The data is loaded into the buffers from the video bus 34 under the timing signal used by the rasterization shown as "local clock" which is coupled through the divider 117 and the double multiplexer 116 for timing to the buffer being loaded from bus 34. When a buffer is being unloaded, the 55 mHz clock is used through divider 115 and multiplexer 116. The buffer which is unloading is selected by multiplexer 114 and the data is passed to line 123 via driver 121. The reverse video blanking circuit 120 allows the video to be reversed, that is, dark for light and light for dark.

The video data can be read from bus 34 onto bus 33 for diagnostics through the scan line recorder 125. Moreover, data from the VME bus 33 can be coupled through the multiplexer/latch 122 and into the buffers 112 and 113 again for diagnostics. This data may be used directly by the optical system when coupled through the drivers 121.

The video generator in addition to providing the driving levels needed through drivers 121 provides a time base change from the time base used in the rasterizer to the time base of the optical system. The two buffers provide a continual flow of data at the high burst rate needed by the optical system.

Thus, a rasterizer has been disclosed which is particularly useful in generating patterns for integrated circuits. The rasterizer makes use of standard DRAMs and the RAS, CAS, WE signals in a hardwired-state machine to provide very rapid rasterization.

We claim:

1. A method for generating a geometric pattern on a substrate, said method comprising the steps of:
   supplying first data representing a trapezoid to be generated on said substrate, said first data comprising location, size and orientation information for said trapezoid;
   converting said first data to second pattern data, wherein said second pattern data defines only triangles and a rectangle to represent said trapezoid;
   generating pixel information from said second data; and
   generating said geometric pattern on said substrate based on said pixel information.

2. The method as recited by claim 1, further comprising the step of storing said second data in a first memory means.

3. The method as recited by claim 2, further comprising the step of storing said pixel information in a second memory means.

4. The method as recited by claim 3, wherein said second data comprises height, width and position information.

5. The method as recited by claim 4, wherein said position information comprises orientation and origin information.

6. The method as recited by claim 5, wherein said origin information comprises x-coordinate information and y-coordinate information.

7. The method as recited by claim 6, wherein said height information comprises a x-column count and said y-information comprises a y-column count.

8. The method as recited by claim 7, wherein said step of generating said pixel information comprises the steps of:
   initializing a first counter means with said x-coordinate information;
   initializing a second counter means with said y-coordinate information;
   performing steps (a) though (d), comprising:
     (a) writing information to said second memory at a location defined by the intersection of the value of said first counter means and the value of said second counter means;
     (b) incrementing said second counter in the direction of patterns orientation;
     (c) repeating steps (a) through (b) y-column count times;
     (d) incrementing said first counter means in the direction of said patterns orientation;
     (e) repeating steps (a) through (d) x-column count times.

9. The method as recited by claim 1, wherein all of the triangles are right angle isosceles triangles.

10. In an apparatus for generating geometric patterns on a substrate, said apparatus including a data input means for receiving first data defining a geometric patter, said data input means coupled to provide said first data to a conversion mean for converting said first data to second pattern data, said conversion means coupled to provide said second pattern data to a rasterization means for converting said second pattern data to pixel data, and said rasterization means coupled to provide said pixel data to a writing means for writing said pixel data to a medium, a method comprising the steps of:
   said data input means receiving said first data, said first data comprising location, size and orientation information for defining a trapezoid;
   said conversion means receiving said first data from said data input means and converting said first data to said second pattern data where said second pattern data defines only triangles and a rectangle to represent said trapezoid;
   said rasterization means receiving said second pattern data from said conversion means and converting said second pattern data to pixel data representative of said at least one geometric object;
   said writing means receiving said pixel data from said rasterization means and writing said pixel data onto said media.

11. The method of claim 10 wherein said second data further includes a second triangle, said first triangle and said second triangle representing portions of said trapezoid.

12. The apparatus as recited by claim 10, wherein all of the triangles are right angle isosceles triangles.

13. An apparatus for generating geometric patterns on a substrate, said apparatus including:
   a storage device for storing first data, said first data defining a trapezoid;
   a processor, being coupled to said storage device, for converting said first data into a second pattern data, wherein said second data uses only triangles and a rectangle to represent said trapezoid;

a rasterizer, being coupled to said processor, for rasterizing said second pattern data to generate pixel data corresponding to said triangles and a rectangle;

an optical system, being coupled to said rasterizer, having a beam output, said beam output corresponding to said pixel data; and a substrate holder being optically coupled to said beam output.

14. The apparatus as recited by claim 13, wherein all of the triangles are right angle isosceles triangles.

* * * * *